United States Patent [19]
Dünnebacke et al.

[11] Patent Number: 5,729,174
[45] Date of Patent: Mar. 17, 1998

[54] CIRCUIT ARRANGEMENT FOR TRANSMITTING AUDIO SIGNALS

[75] Inventors: Joachim Dünnebacke, Herborn; Dirk Schwantes-Roy, Wetzlar, both of Germany

[73] Assignee: U.S. Philips Corporation, New York, N.Y.

[21] Appl. No.: 673,832

[22] Filed: Jun. 27, 1996

[30]     Foreign Application Priority Data

Jul. 12, 1995 [EP] European Pat. Off. .............. 19525410

[51] Int. Cl.⁶ .................................................. H03F 3/68
[52] U.S. Cl. .................................... 330/51; 330/124 R
[58] Field of Search ......................... 330/51, 146, 124 R, 330/295; 381/120

[56]            References Cited

U.S. PATENT DOCUMENTS

| | | | |
|---|---|---|---|
| 5,161,198 | 11/1992 | Noble ................................... | 381/120 X |
| 5,332,976 | 7/1994 | Dünnebacke ........................ | 330/124 R |
| 5,365,188 | 11/1994 | Botti et al. .......................... | 330/51 |
| 5,610,555 | 3/1997 | Funahashi et al. ................. | 330/124 R X |

FOREIGN PATENT DOCUMENTS

0613242A1  8/1994  European Pat. Off. .

*Primary Examiner*—Steven Mottola
*Attorney, Agent, or Firm*—Edward W. Goodman

[57]            ABSTRACT

A circuit arrangement for transmitting audio signals includes a signal amplifier having four power amplifiers each with an input and an output, a first and a third one of the four power amplifiers are non-inverting for applied audio signals, and a second and a fourth one of the four power amplifiers are inverting, the inputs of the first and second power amplifiers receiving a first audio signal and the inputs of the third and fourth power amplifiers receiving a second audio signal. In a first configuration mode for audio signals of low amplitude, the first and fourth power amplifiers each form a single-ended amplifier and the outputs of the second and/or the third power amplifier carry a reference potential. In a second configuration mode for audio signals of higher amplitude, the first and second power amplifiers form a first bridge amplifier, and the third and fourth power amplifiers form a second bridge amplifier. The outputs of the first and second power amplifiers are arranged for the connection of a first signal sink and the outputs of the third and fourth power amplifiers are arranged for the connection of a second signal sink. An automatic change-over to the second configuration mode IS effected if the signal sinks include further amplifier arrangements. At very low cost this also provides compatibility for a symmetrical signal amplifier with signal sinks having asymmetrical inputs.

6 Claims, 2 Drawing Sheets

5,729,174

CIRCUIT ARRANGEMENT FOR TRANSMITTING AUDIO SIGNALS

BACKGROUND OF THE INVENTION

1. Field of The Invention

The invention relates to a circuit arrangement for transmitting audio signals.

2. Description of The Related Art

EP 0 613 242 A1, corresponding to U.S. Pat. Nos. 5,365,188 and 5,444,417, discloses a self-configurable dual-bridge power amplifier adapted to drive two loudspeakers. A plurality of configuring switches enable the amplifier to be operated selectively as a single bridge amplifier driving the two loudspeakers in series arrangement or as a configuration with two distinct bridge amplifiers, each driving one of the loudspeakers. In the first-mentioned case, a center tap of the series arrangement of the loudspeakers is connected to a reference potential, as a result of which said single bridge amplifier operates as a combination of two single-ended amplifiers. As long as the levels of the input signals applied to the amplifier remain within an interval between two reference voltages, the amplifier will operate as a single-bridge amplifier or a double single-ended amplifier. If the levels of the input signals exceed said reference voltages, the amplifier will be operated as a dual-bridge amplifier.

Such an amplifier arrangement serves to reduce the losses in the amplifier stages for small signal amplitudes.

It is advantageous to connect a pair of loudspeakers for a stereo channel to a prior-art amplifier arrangement for sound reproduction in a motor vehicle or the like, one of the loudspeakers being preferably mounted in the front part and the second loudspeaker in the rear part of the space in which the sound is to be reproduced. Depending on the amplitude of the processed audio signal, the amplifier arrangement then forms a single-ended or a bridge amplifier, which can drive the loudspeakers with different signals, in particular also signals of different amplitudes. In the configuration of the amplifier arrangement as two single-ended amplifiers with a series-connected loudspeaker pair, referred to as the first configuration mode, the node ("tap", see above) between the loudspeakers only carries the described reference potential and no audio signal. An audio signal is applied to each of the loudspeaker terminals via one stage of the amplifier arrangement in the bridge mode only, which mode is also referred to as the second configuration mode, in which the amplifier arrangement operates as two bridge amplifiers, one for each loudspeaker.

The loudspeakers connected to the amplifier arrangement each represent a symmetrical signal sink. If they are replaced by equally symmetrical signal sinks of different structures the amplifier arrangement will operate in a similar manner because symmetrical inputs only process the difference between the input signals and it is therefore irrelevant whether an audio signal or a reference potential is applied to a terminal of a symmetrical input. However, a different situation arises when signal sinks with asymmetrical inputs are connected.

In the case of a physical separation between the signal source (car radio) and an additional amplifier (sound system), output stages of the car radio are often used as drivers in order to obtain high signal levels and, consequently, large signal to noise ratios for the transfer to the input lines to the booster amplifier. Moreover, this will permit the use of non-screened leads. When the inputs of these sound systems are symmetrical, i.e. have a positive and a negative input for each channel, i.e. for each loudspeaker, they can be connected to the outputs of the signal amplifier described above without any problems.

However, the situation becomes entirely different if the sound system has an asymmetrical input for reasons of simplicity. This situation occurs particularly in the case of older products, particularly car radios, which have only single-ended output stages. The output terminals of these single-ended output stages are also asymmetrical so that it is useful to connect a sound system with asymmetrical inputs to these stages. The inputs of the sound system are then driven with the desired signals in the correct phase relationship.

However, problems will arise if, for example, a car radio of a newer type is to be mounted in a motor vehicle with such a sound system having asymmetrical outputs, the output stages of this car radio being formed by a signal amplifier of the type defined in the opening paragraph, having symmetrical outputs. It will then be found that some of the channels of the sound system, i.e., some of the loudspeakers, no longer receive an audio signal when the signal amplifier operates in the first configuration mode. Thus, apparatuses comprising signal amplifiers of the type defined in the opening paragraph then cannot be combined with line drivers or sound systems having asymmetrical inputs.

SUMMARY OF THE INVENTION

It is an object of the invention to provide simple means enabling said arrangements to be combined and to be operated in combination with one another without any problems.

According to the invention this object is achieved by a circuit arrangement for transmitting audio signals, having a signal amplifier comprising four power amplifiers each having an input and an output, of which a first one and a third one are non-inverting for audio signals applied to them and of which a second one and a fourth one are inverting, the inputs of the first and the second power amplifier being arranged to receive a first audio signal and the inputs of the third and the fourth power amplifier being arranged to receive a second audio signal, in which, in a first configuration mode for audio signals of low amplitude, the first and the fourth power amplifier each form a single-ended amplifier and the outputs of the second and/or the third power amplifier carry a reference potential, and in which, in a second configuration mode for audio signals of higher amplitude, the first and the second power amplifier form a first bridge amplifier and the third and the fourth power amplifier form a second bridge amplifier, the outputs of the first and the second power amplifier being arranged for the connection of a first signal sink and the outputs of the third and the fourth power amplifier being arranged for the connection of a second signal sink, an automatic change-over to the second configuration mode being effected if the signal sinks include further amplifier arrangements.

The invention enables a self-configurable signal amplifier with symmetrical outputs to be used without any modification of the circuit arrangement both in conjunction with an input circuit having symmetrical inputs and with an input circuit having asymmetrical inputs. In the case of subsequent mounting or replacement of devices, for example, a car radio, no adaptations are necessary to existing devices or to new devices to be built in. It is merely necessary to ensure that at least when an input circuit with asymmetrical inputs is to be driven, the driving signal amplifier operates automatically in the second configuration mode, i.e., in the bridge mode, for all amplitudes of the audio signals to be processed. This is possible without the operation and the audio-signal reproduction quality being affected because the input circuits of the sound systems have substantially higher input resistances than the loudspeakers and the power dissipations in the signal amplifier are substantially smaller right from the start.

Obviously, the invention can also be applied to arrangements of signal amplifiers comprising a plurality of groups of four power amplifiers each. If a signal amplifier with four power amplifiers is preferably used for driving two loudspeakers (for example front and rear) of a stereo channel, signal amplifier arrangements comprising a plurality of groups of four power amplifiers each can be used to process multi-channel stereo signals.

Preferably, the automatic change-over to the second configuration mode is effected in car-radio/sound system combinations. Preferably, at least one booster amplifier is connected to the car radio via leads. However, the sound reproducing devices, particularly loudspeakers, may also be connected directly to the signal amplifiers. The invention then provides a maximal design freedom.

Although the invention is preferably adapted for the use of signal sinks with asymmetrical inputs operation in conjunction with signal sinks having symmetrical inputs, is also possible in the same way. The automatic change-over in accordance with the invention may then be operative exclusively in those cases in which such a signal sink having asymmetrical inputs is present. However, as will be apparent from the foregoing, the automatic change-over of the signal source (car radio) to the second configuration mode may, in principle, be initiated by all signal sinks which include further amplifier arrangements and consequently have inputs with a comparatively high impedance. This leads to hardly any higher losses but it may simplify the construction. This will be explained hereinafter.

Preferably, (c5). This control signal may, for example, stem from the sound system. Alternatively, the control signal may be applied via a data bus. However, this implies that the sound system or the radio should be adapted to supply such a control signal or that a data bus of the said type should be available. However, usually this will not be the case. Therefore, it is advantageous if an appropriate control signal is generated by the circuit arrangement in accordance with the invention or a variant thereof.

A variant of the invention which enables such a control signal to be generated in a manner which is as simple as possible and independently of the other parts, for example the car-radio system, comprises a measurement and control circuit for measuring the load impedances brought about by the signal sinks at the outputs of the power amplifiers and for the automatic change-over to the second configuration mode when the load impedances exceed a given value. For the connection of a sound system for two loudspeakers, i.e., with two channels, it is then possible to measure two impedances. If the two impedance values exceed the given value, the measurement and control circuit detects that one line driver or one sound system is connected, the type of line driver—with symmetrical or asymmetrical inputs—being irrelevant in the simplest case. Thus, when such a measurement and control circuit is used, an automatic change-over to the second configuration mode is as simple as possible for any line driver regardless of the kind of inputs it has, whereas a detection of and distinction between symmetrical and asymmetrical inputs entails a greater complexity without any significant advantage, i.e., a reduction of the power dissipation, being obtained.

On the other hand, a measurement of two impedances may also be used for error detection. For example, an error is detected always when one of the measured impedances is higher and the second is lower than the given value.

BRIEF DESCRIPTION OF THE DRAWINGS

The drawings serve to clarify, by way of example, an embodiment of the invention, and in the drawings.

DESCRIPTION OF THE PREFERRED EMBODIMENT

Figure 1:
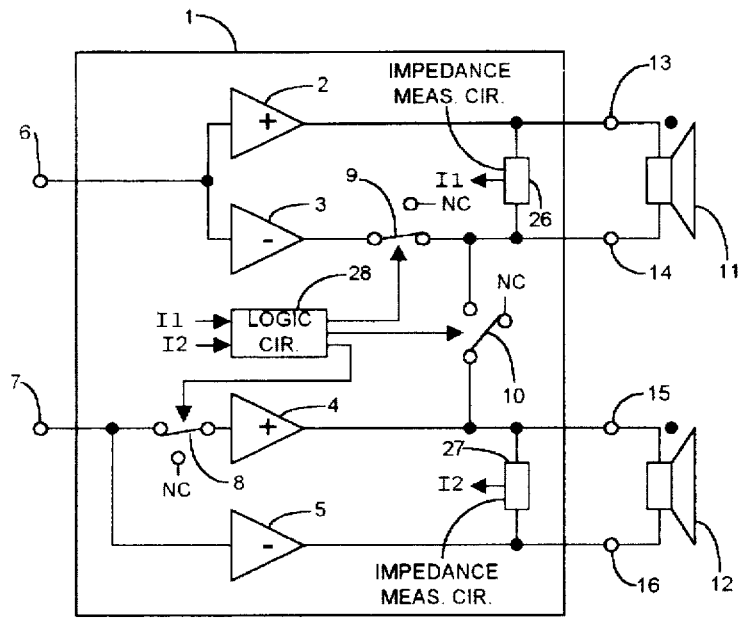
FIG. 1 shows, block-schematically, a signal amplifier as used for the invention.

FIG. 1 shows, block-schematically, a circuit arrangement of a signal amplifier 1, as basically known from EP 0 613 242 A1. The signal amplifier 1 comprises a non-inverting first power amplifier 2, an inverting second power amplifier 3, a non-inverting third power amplifier 4, and an inverting fourth power amplifier 5. The first and the second power amplifier 2, 3 have their inputs connected to a first audio signal input 6 and the third and the fourth power amplifier 4, 5 have their inputs connected to a second audio signal input 7. The input of the third power amplifier 4 is connected via a first switch 8, which is a change-over switch and by which the input of the third power amplifier 4 can be connected selectively to the second audio signal input 7 or to a reference potential. A first loudspeaker 11, which forms a first signal sink, has its terminals 13, 14 connected to the outputs of the first and the second power amplifier 2 and 3, respectively. Likewise, a second loudspeaker 12, which forms a second signal sink, has its terminals 15 and 16 connected to the outputs of the third and the fourth power amplifier 4 and 5, respectively. The polarities of the loudspeakers 11, 12 are indicated by means of dots. The output of the second power amplifier 3 and the terminal 14 of the first loudspeaker 11 are connected to one another via a second switch 9, which is a circuit breaker. A third switch 10, which is also a circuit breaker, selectively establishes a connection between the outputs of the second and the third power amplifier 3, 4 or between the terminals 14 and 15 of the loudspeakers 11, 12.

As described in detail in EP 0 613 242 A1, the signal amplifier 1 can assume two configuration modes. In the first configuration mode, in which the switches 8, 9, 10 are in the positions shown, the first and the second power amplifier 2, 3 form a bridge amplifier for the first loudspeaker 11 (i.e., the first signal sink) and the third and the fourth power amplifier 4, 5 form bridge amplifier for the second loudspeaker 12 (i.e., the second signal sink), by means of these bridge amplifiers, the loudspeakers 11, 12 can be driven independently of one another with the audio signals applied to the audio signal inputs 6, 7. Such a signal amplifier 1 is mounted, for example, in a motor vehicle to drive a front loudspeaker and a rear loudspeaker for a stereo channel with audio signals which differ from one another at least in amplitude.

In the second configuration mode, the switches 8, 9, 10 are in positions opposite to those shown in FIG. 1. Thus, the first switch 8 transfers the reference potential to the input of the third power amplifier 4, the second switch 9 interrupts the signal at the output of the second power amplifier 3, and the third switch 10 connects the terminals 14 and 15 of the loudspeakers 11, 12 to one another (and to the output of the third power amplifier 4). In this second configuration mode, the signal amplifier 1 forms two single-ended amplifiers for the two loudspeakers 11, 12, the third power amplifier 4 serving as a buffer amplifier for the transfer of the reference potential to the interconnected terminals 14, 15.

Preferably, the first configuration mode is used for low amplitudes of the audio signals at the audio signal inputs 6, 7, and the second configuration mode is used for high amplitudes of these audio signals.

Figure 2:
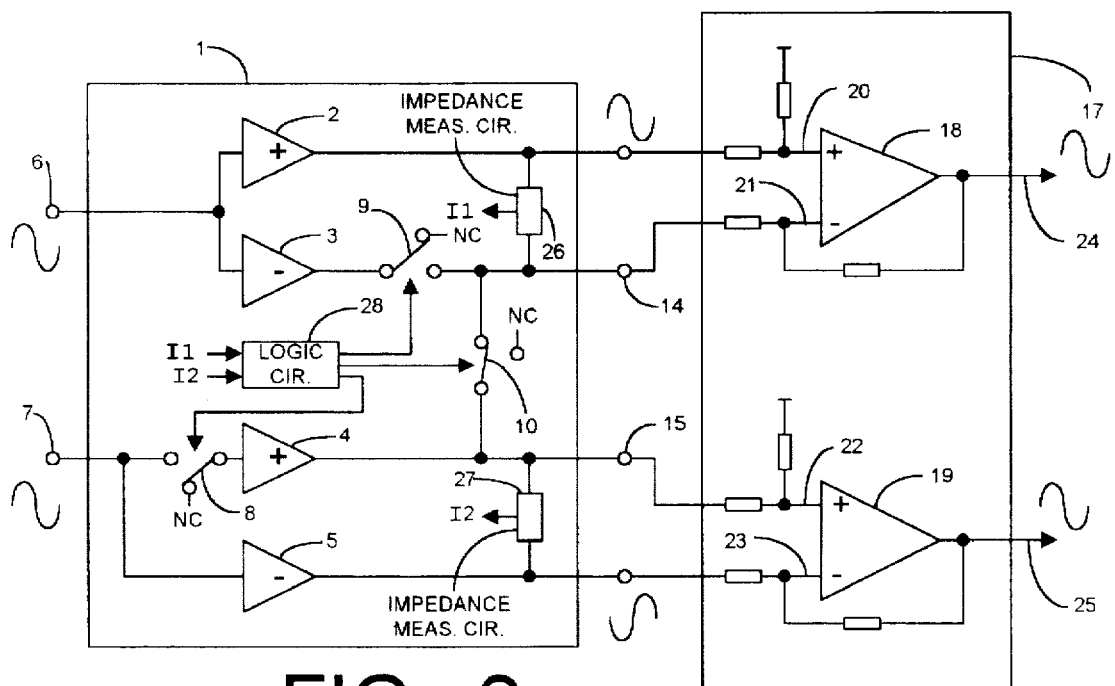
FIG. 2 shows a coupling of the signal amplifier of FIG. 1 to a sound system having symmetrical inputs.

FIG. 2, in which elements already described bear the same reference symbols, shows a connection of the signal amplifier 1 to symmetrical inputs of, for example, a sound system for a car radio. This input circuit 17 has an amplifier, for example an operational amplifier, 18 or 19 for each channel. The amplifiers 18, 19 have input and feedback resistors arranged in a manner known per se. A non-inverting input 20 of the first amplifier 18 is connected to the output of the first power amplifier 2, an inverting input 21 of the first amplifier 18 is connected to the output of the second power amplifier 3, a non-inverting input 22 of the second amplifier 19 is connected to the output of the third power amplifier 4, and an inverting input 23 of the second amplifier 19 is connected to the output of the fourth power amplifier 5. An output 24 of the first amplifier 18 then carries the amplified audio signal for the first loudspeaker channel, an output 25 of the second amplifier 19 carries the amplified audio signal for the second loudspeaker channel. For further signal processing, for example, filters, compressors, DSPs or output stages may be connected to the outputs 24, 25 asymmetrically relative to ground.

FIG. 2 shows the signal amplifier 1 in the second configuration mode. The amplifiers 18, 19 of the input circuit 17 are then connected to the signal amplifier 1 with their inputs 20 to 23. The sinewave symbols at the audio signal inputs 6, 7, the outputs of the first and the fourth power amplifier 2, 5 and the outputs 24, 25 symbolize the path of the audio signals to be transmitted. It will be seen that no audio signal appears at the output of the power amplifier 4 and, consequently, at the inputs 21 and 22 but that this does not affect the signal transmission because the input circuit 17 only processes the difference between the inputs 20, 21 and 22, 23, respectively.

The signal amplifier 1 includes means for automatically changing over from the first configuration to the second configuration depending on the nature of the signal sinks connected to the outputs of the signal amplifier 1. In particular, a first impedance measuring circuit 26 is connected across the outputs 13 and 14 for measuring the impedance I1 of the signal sink connected thereacross. Similarly, a second impedance measuring circuit 27 is connected across the outputs 15 and 16 for measuring the impedance I2 of the signal sink connected thereacross. A logic circuit 28 receives the impedance values I1 and I2 from the first and second impedance measuring circuits 26 and 27, and if these values exceed a given value, the logic circuit 28 controls the switches 8, 9 and 10 to effect the second configuration. As is known, the impedance of loudspeakers is typically low, e.g., 8 ohms, while the input impedance of amplifier input circuits is typically high, e.g., 100 kohms. Hence, if the given value is set at, for example, 100 ohms, the logic circuit 28 will be able to distinguish whether the signal amplifier 1 is connected directly to loudspeakers (symmetrically) or to input circuits of, for example, a sound system for a car radio (or asymmetrically to loudspeakers).

Figure 3:
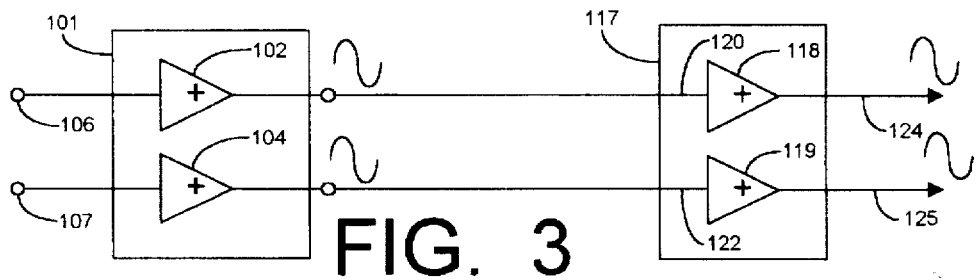
FIG. 3 is a simplified diagram showing a combination of a signal amplifier and a sound system having asymmetrical inputs.

FIG. 3 is a simplified block-schematic diagram showing a variant of the circuit arrangement of FIG. 2 and comprising a signal amplifier 101 in an asymmetrical version and an asymmetrical input circuit 117. The input circuit 117 again comprises two amplifiers 118, 119, now arranged for asymmetrical signal and asymmetrical version of the signal amplifier 101 only comprises a first and a third power amplifier 102, 104 both of the non-inverting type. The inputs 20, 23 of the amplifiers 18, 19 of the line driver 17 in FIG. 2 correspond to the inputs 120, 122 of the amplifiers 118, 119 of the input circuit 117 in FIG. 3. In this asymmetrical arrangement, the audio signal path is also symbolized by sinewave symbols. It will be seen that the signals are transferred correctly from the audio signal inputs 106, 107 of the signal amplifier 101, which correspond to the audio signal inputs 6 and 7, to the outputs 124, 125 of the input circuit 117, which correspond to the outputs 24, 25.

Figure 4:
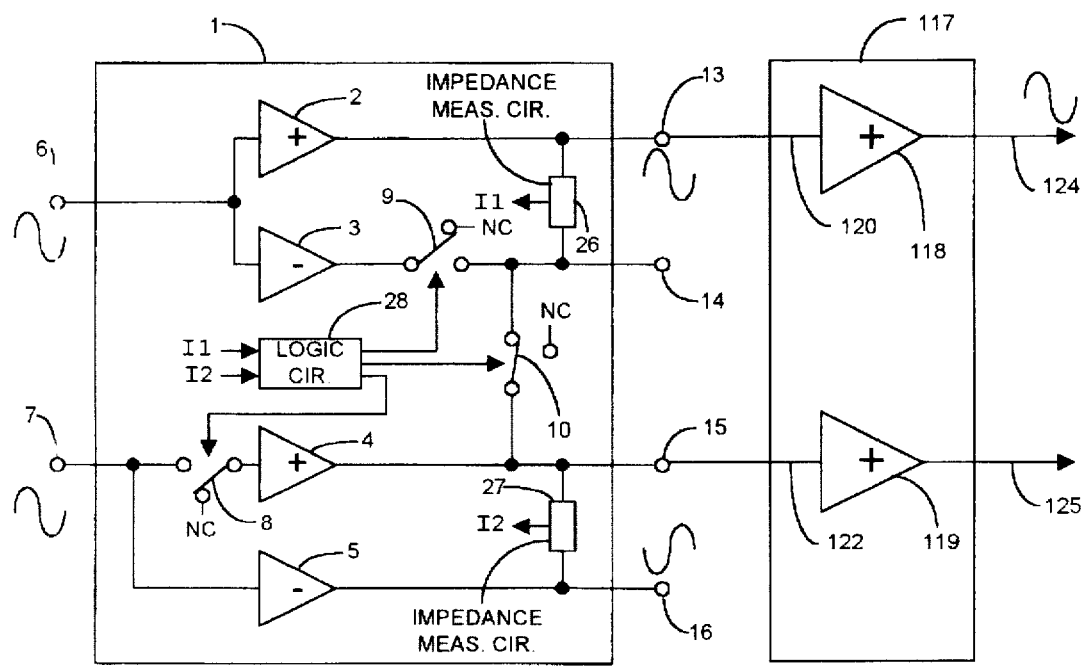
FIG. 4 shows a combination of a signal amplifier as shown in FIG. 1 with a sound system having asymmetrical inputs as shown in FIG. 3 in the first configuration mode of the signal amplifier.

However, the situation is different if, as in FIG. 4, the signal amplifier 1 shown in FIG. 2 is coupled to the input circuit 117 shown in FIG. 3. As is apparent from the sinewave symbols, the input 122 and consequently the output 125 of the second amplifier 119 of the input circuit 117 receives no audio signal in the second configuration mode shown here. This undesired situation cannot be remedied simply in that the input 122 of the second amplifier 119 is now connected to the output of the fourth power amplifier 5 instead of to the output of the third power amplifier 4, because the audio signal at the output 125 would then appear phase-inverted at the output 125 and would thereby disturb the entire audio signal reproduction.

Figure 5:
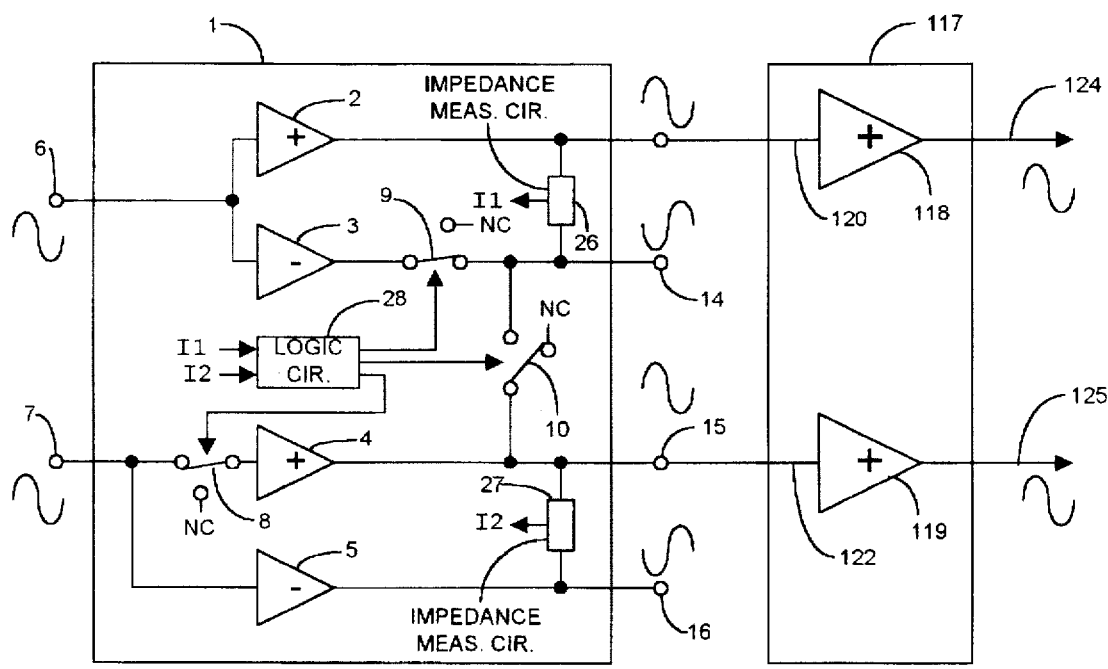
FIG. 5 show the arrangement of FIG. 4 in the second configuration mode of the signal amplifier.

FIG. 5 shows the circuit arrangement of FIG. 4 in the first configuration mode. The sinewave symbols again indicate the audio signal path, the different versions of these sinewave symbols also indicating the phase of the audio signals. It can be seen that now the audio signals appear at the outputs 124, 125 with the correct phase relationship. Thus, the undesired situation shown in FIG. 4 can be remedied very simply in that the signal amplifier 1 is always kept in the second configuration mode by the automatic change-over in accordance with the invention. This enables a correct transmission of the audio signals in a combination of a signal amplifier 1 with an input stage 17 as shown in FIG. 2 and also with an (asymmetrical) input stage 117 as shown in FIG. 4 or 5 to be realized properly, without any additional adaptations being necessary. This is very advantageous, for example, if in a sound system of an older type the signal source (car radio) including the signal amplifier 101 is to be replaced by an improved model comprising a signal amplifier 1. The connections can then be identical for both car radio models.

In addition, for the connection of a sound system the automatic change-over to the second configuration mode, i.e., to operation as a dual bridge amplifier, also has the advantage that it precludes disturbances which could occur in the audio signal during change-over between the two configuration modes and which could become audible owing to a higher power rating and the use of better loudspeakers. Therefore, an automatic change-over in accordance with the invention can also be effected when an input circuit 17 with symmetrical inputs is used.

We claim:

1. A circuit arrangement for transmitting audio signals, having a signal amplifier comprising four power amplifiers each having an input and an output, of which a first and a third of said four power amplifiers are non-inverting for applied audio signals and a second and a fourth of said four power amplifiers are inverting, the inputs of the first and second power amplifiers receiving a first audio signal and the inputs of the third and fourth power amplifiers receiving a second audio signal, wherein, in a first configuration mode for audio signals of low amplitude, the first and fourth power amplifiers each form a single-ended amplifier and the outputs of the second and/or the third power amplifier carry a reference potential, and wherein, in a second configuration mode for audio signals of higher amplitude, the first and second power amplifiers form a first bridge amplifier and the third and fourth power amplifiers form a second bridge amplifier, the outputs of the first and second power amplifiers being connectable to a first signal sink and the outputs of the third and fourth power amplifiers being connectable to a second signal sink, said circuit arrangement further comprising means for automatically changing over said circuit arrangement to the second configuration mode if the signal sinks include further amplifier arrangements.

2. A circuit arrangement as claimed in claim 1, wherein the automatic change-over means effects the change-over to the second configuration mode in car-radio/sound-system combinations.

3. A circuit arrangement as claimed in claim 2, wherein said circuit arrangement connects at least one sound reproducing device to the car-radio sound system via one line for each device.

4. A circuit arrangement as claimed in claim 2, wherein the signal sinks have asymmmetrical inputs.

5. A circuit arrangement as claimed in claim 1, wherein the car-radio is arranged to receive a control signal for the automatic change-over of the circuit arrangement to the second configuration mode.

6. A circuit arrangement as claimed in claim 1, wherein said automatic change-over means comprises measurement circuits for measuring load impedances brought about by the signal sinks at the outputs of the power amplifiers, and a control circuit for changing over said circuit arrangement to the second configuration mode when the load impedances measured by said measurement circuits exceed a given value.

* * * * *